United States Patent
Hanson et al.

(10) Patent No.: US 6,969,682 B2
(45) Date of Patent: Nov. 29, 2005

(54) SINGLE WORKPIECE PROCESSING SYSTEM

(75) Inventors: Kyle M. Hanson, Kalispell, MT (US); Paul Z. Wirth, Columbia Falls, MT (US); Steven L. Peace, Whitefish, MT (US); Jon Kuntz, Kalispell, MT (US); Scott A. Bruner, Kalispell, MT (US)

(73) Assignee: Semitool, Inc., Kalispell, MT (US)

(*) Notice: Subject to any disclaimer, the term of this patent is extended or adjusted under 35 U.S.C. 154(b) by 92 days.

(21) Appl. No.: 10/693,668

(22) Filed: Oct. 24, 2003

(65) Prior Publication Data

US 2004/0129302 A1 Jul. 8, 2004

Related U.S. Application Data

(63) Continuation-in-part of application No. 10/202,074, filed on Jul. 23, 2002, which is a continuation of application No. 09/437,711, filed on Nov. 10, 1999, now Pat. No. 6,423,642, which is a continuation-in-part of application No. PCT/US99/05676, filed on Mar. 15, 1999.

(60) Provisional application No. 60/116,750, filed on Jan. 22, 1999, and provisional application No. 60/117,474, filed on Jan. 27, 1999.

(51) Int. Cl.[7] ............................................. H01L 21/311
(52) U.S. Cl. .................... 438/694; 438/758; 438/906; 438/913; 118/729; 118/730; 134/153; 134/155; 134/157
(58) Field of Search .............................. 438/694, 758, 438/906, 913; 118/715–723, 729–730, 900–902; 134/153–157; 156/345.55

(56) References Cited

U.S. PATENT DOCUMENTS

| | | | | |
|---|---|---|---|---|
| 5,443,644 A | * | 8/1995 | Ozawa | 118/715 |
| 5,500,081 A | * | 3/1996 | Bergman | 438/706 |
| 5,551,986 A | * | 9/1996 | Jain | 134/6 |
| 5,664,337 A | * | 9/1997 | Davis et al. | 34/58 |
| 6,139,639 A | * | 10/2000 | Kitamura et al. | 118/680 |
| 6,264,752 B1 | * | 7/2001 | Curtis et al. | 118/729 |
| 6,309,520 B1 | | 10/2001 | Woodruff et al. | |
| 6,328,846 B1 | | 12/2001 | Langen et al. | |
| 6,334,937 B1 | | 1/2002 | Batz, Jr. et al. | |
| 6,350,319 B1 | * | 2/2002 | Curtis et al. | 118/715 |
| 6,423,642 B1 | | 7/2002 | Peace et al. | |
| 6,435,200 B1 | | 8/2002 | Langen | |
| 6,548,411 B2 | * | 4/2003 | Wirth et al. | 438/694 |
| 6,695,914 B2 | * | 2/2004 | Curtis et al. | 118/50 |
| 2002/0185163 A1 | * | 12/2002 | Peace et al. | 134/137 |

FOREIGN PATENT DOCUMENTS

WO    WO 99/46065    9/1999

* cited by examiner

*Primary Examiner*—Matthew Smith
*Assistant Examiner*—Granvill D. Lee, Jr.
(74) *Attorney, Agent, or Firm*—Perkins Coie LLP

(57) ABSTRACT

A system for processing wafers includes a robot moveable within an enclosure to load and unload workpieces into and out of workpiece processors. A processor includes an upper rotor having alignment pins, and a lower rotor having one or more openings for receiving the alignment pins to form a processing chamber around the workpiece. The alignment pins center the workpiece relative to a rotor spin axis and to an etch or drain groove in the upper rotor. A first fluid outlet delivers processing fluid to a central region of the workpiece. The processing fluid is distributed across the workpiece surface via centrifugal force generated by spinning the processing chamber. Purge gas is optionally delivered into the processing chamber through an annular opening around the first fluid outlet to help remove processing fluid from the processing chamber.

37 Claims, 18 Drawing Sheets

SINGLE WORKPIECE PROCESSING SYSTEM

This Application is a Continuation-In-Part of U.S. patent application Ser. No. 10/202,074, filed Jul. 23, 2002 and now pending, which is a Continuation of U.S. patent application Ser. No. 09/437,711, filed Nov. 10, 1999, now U.S. Pat. No. 6,423,642, which is a Continuation-In-Part and U.S. National Phase of: International Patent Application No. PCT/US99/05676, filed Mar. 15, 1999, published in English and designating the United States, and claiming priority to U.S. Patent Application No. 60/116,750, filed Jan. 22, 1999 and 60/117,474, filed Jan. 27, 1999. These Applications are incorporated herein by reference.

BACKGROUND OF THE INVENTION

Microelectronic devices are used in a wide array of products. These devices, such as memory and microprocessor chips and similar devices have traditionally been used in, for example, computers, telephones, sound equipment and other electronic products. Over the last several years, microelectronic devices have become faster, better, and less expensive. Microelectronic devices are accordingly now also used in traditionally non-electronic products, such as appliances, vehicles, toys and games, medical devices, novelty items, etc. The remarkable progress made in the microelectronic device industry has led to improved yet less expensive products of all types. It has also led to entirely new types of products.

A major factor in the development of microelectronic devices has been the machines and methods used to manufacture them. Manufacturing of microelectronic devices requires extreme precision, extremely pure materials, and an extremely clean manufacturing environment. Even tiny particles of dust, dirt, metals, or manufacturing chemicals, at almost any stage of the manufacturing process, can cause defects and failures in devices. Reducing contaminants is therefore critical to cost effective manufacturing. Accordingly, intensive research and development has focused on reducing contaminants in microelectronic manufacturing processes.

As microelectronic devices are made smaller, reducing contaminants has become even more important, and more difficult to achieve. In the past, various approaches have been used to reduce contaminants. These include use of materials that tend not to generate particles, careful selection and placement of mechanical components in processing machines, and use of a flow of highly filtered and clean air or gases, to carry any particles generated away from the wafers or substrates which form the microelectronic devices.

Even though these techniques have been successful, engineering challenges remain in trying to further reduce contamination, and to provide more reliable and cost effective manufacturing. As described below, the inventors of the new machines and methods described in this patent application have made developments which offer significantly improved manufacturing of microelectronic devices.

Manufacturing of microelectronic devices involves using various chemicals. These chemicals are typically in liquid form, although gases and vapors are also often used. These chemicals must be highly pure and are therefore expensive. Chemicals used in some processes, such as strong acids or oxidizers, are also toxic. Use of these chemicals, and disposal of the chemicals after they are used, can be time consuming and expensive. Consequently, reducing the amount of chemicals used is highly advantageous. On the other hand, in general, enough of the chemicals must be provided so that they can be uniformly applied over all surfaces of the wafer or substrate being processed or manufactured. It can therefore be difficult to minimize chemical consumption, while maintaining good manufacturing results.

Manufacturing microelectronic devices also typically requires large amounts of purified and de-ionized water. After it is used, e.g., for rinsing, the water typically will have small amounts of dissolved chemicals in it. The water then also often requires special handling and disposal efforts. Accordingly, reducing the amount of water used, as well as the amounts of chemicals used, would be highly advantageous.

One problem that may arise in existing microelectronic device manufacturing systems is non-uniform processing or etching. Non-uniform etching may occur when a microelectronic workpiece is not precisely aligned within a rotating processing chamber. When a wafer or workpiece is improperly aligned in a rotating processing chamber, non-concentric etching of the workpiece may occur, which can be particularly problematic when the edge of the workpiece is being processed. In this case, a larger edge region is processed on one side of the workpiece diameter than on the other side. As a result, fewer microelectronic devices can be produced from the workpiece. Thus, there is a need for a workpiece processing system that more precisely aligns a workpiece in a processing chamber.

Another problem in existing workpiece processing systems arises when processing fluids are not thoroughly removed from the processing chamber, which can result in the mixing of different processing fluids, as well as fluid deposition on the workpiece surfaces. At certain times, even a few drops of excess fluid can result in defects or failure of the microelectronic end products. Thus, there is a need for a workpiece processing system that thoroughly removes processing fluids from the processing chamber.

SUMMARY OF THE INVENTION

After extensive research and development, the inventors have created a new processing system, which provides dramatic improvements in manufacturing microelectronic and similar devices. This new system reduces contamination and increases wafer yield. As a result, there are fewer defects in the end products, and a maximum number of device chips are produced per wafer. This reduces the total amount of raw materials, chemicals, water, time, labor, and effort required to manufacture microelectronic devices, as well as the overall cost of manufacturing the devices. Correspondingly, less waste, such as used chemicals and waste water, are created. By using chemicals and water in new and more efficient ways, high manufacturing quality standards are achieved, yet with less chemical and water consumption, when compared with existing systems now in use.

One feature of the invention is a new system that includes a first rotor having a plurality of alignment pins, and a second rotor having one or more openings for receiving the alignment pins to form a workpiece processing chamber with the first rotor. This rotor design keeps the first (upper) rotor centered on the second (lower) rotor, and also keeps a workpiece centered within the processing chamber. This improves the manufacturing yield or efficiency of the system, by reducing eccentricity in the etch zone and thereby increasing the number of device chips produced per wafer.

Another separate feature of the invention is a new system that includes a substantially annular opening around an outer periphery of a fluid applicator in the first rotor. The fluid applicator is positioned to deliver a processing fluid to a central region of a workpiece in the processing chamber. A purge gas line is positioned for delivering a purge gas into the annular opening toward the workpiece. This provides for more uniform delivery of purge gas into, and dispersion throughout, the processing chamber. Consequently, manufacturing is more consistent, and workpiece defects are reduced.

In another separate feature of the invention, a new system includes a fluid applicator in the second rotor for delivering a processing fluid to an edge of a workpiece located in the processing chamber. One or more drain openings are preferably located in the first rotor for removing the processing fluid from the processing chamber. Purge gas is advantageously delivered across the upper surface of the workpiece. In one embodiment, a shield plate is located above the fluid applicator for directing the processing fluid to the edge of the workpiece. In a separate embodiment, a fluid delivery path extends from the fluid applicator and terminates at the edge of the workpiece for delivering the processing fluid directly to the edge of the workpiece. These designs provide for improved edge processing of the workpiece.

Other features and advantages of the invention will appear hereinafter. The features of the invention described above can be used separately or together, or in various combinations of one or more of them. The rotor configurations and fluid delivery designs can be used alone, or in a system with robotic automation. Additionally, the rotor configurations and fluid delivery designs can be used separately from each other, or together. The invention resides as well in sub-combinations of the features described.

BRIEF DESCRIPTION OF THE DRAWINGS

In the drawings, wherein the same reference number denotes the same element, throughout the several views.

DETAILED DESCRIPTION OF THE DRAWINGS

The invention is directed to apparatus and methods for processing a workpiece, such as a semiconductor wafer. The term workpiece, wafer, or semiconductor wafer means any flat media or article, including semiconductor wafers and other substrates or wafers, glass, mask, and optical or memory media, MEMS substrates, or any other workpiece having micro-electronic, micro-mechanical, or microelectro-mechanical devices.

Figure 1:
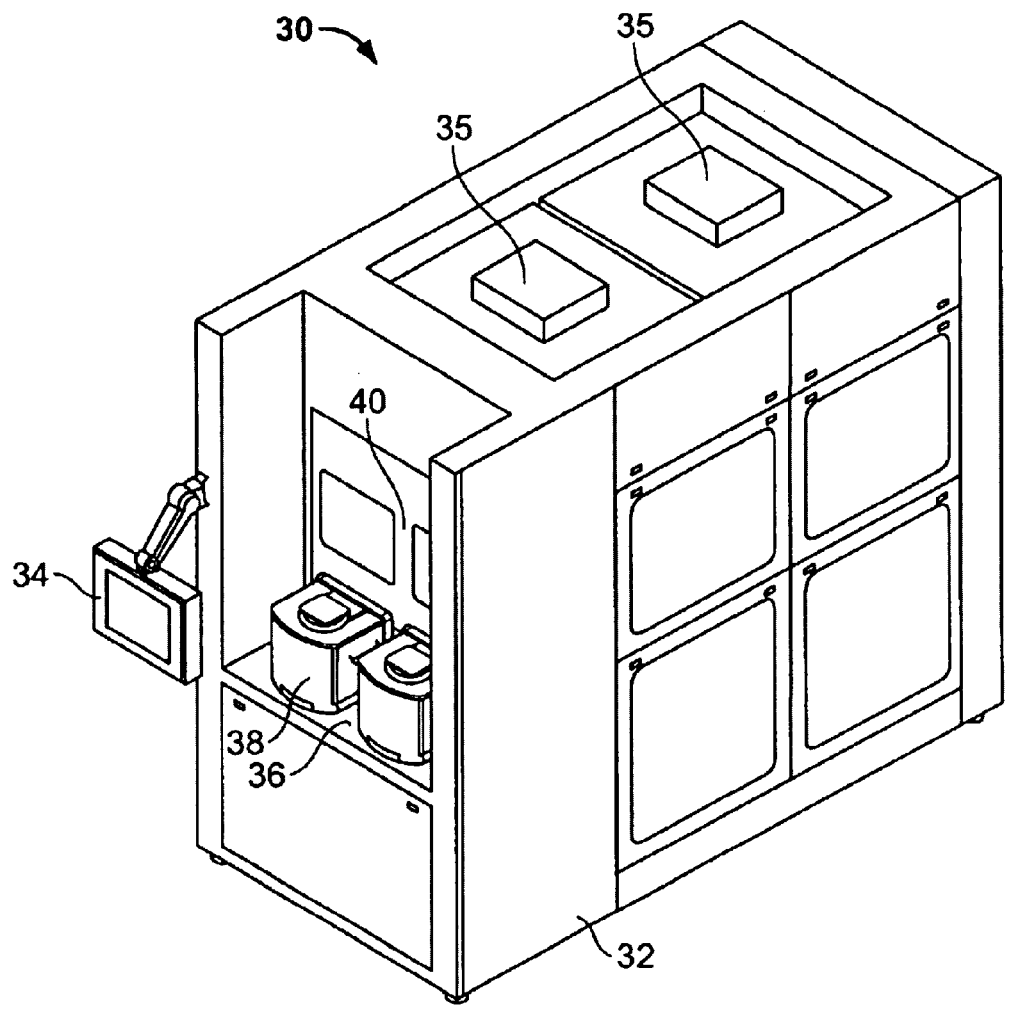
FIG. 1 is a perspective view of a workpiece processing system.

As shown in FIG. 1, a processing system 30 has an enclosure 32, a control/display 34, and an input/output station 36. Wafers or workpieces within pods or boxes 38 (e.g., FOUPs) are removed from the boxes 38 at the input/output station 36 and processed within the system 30.

Figure 2:
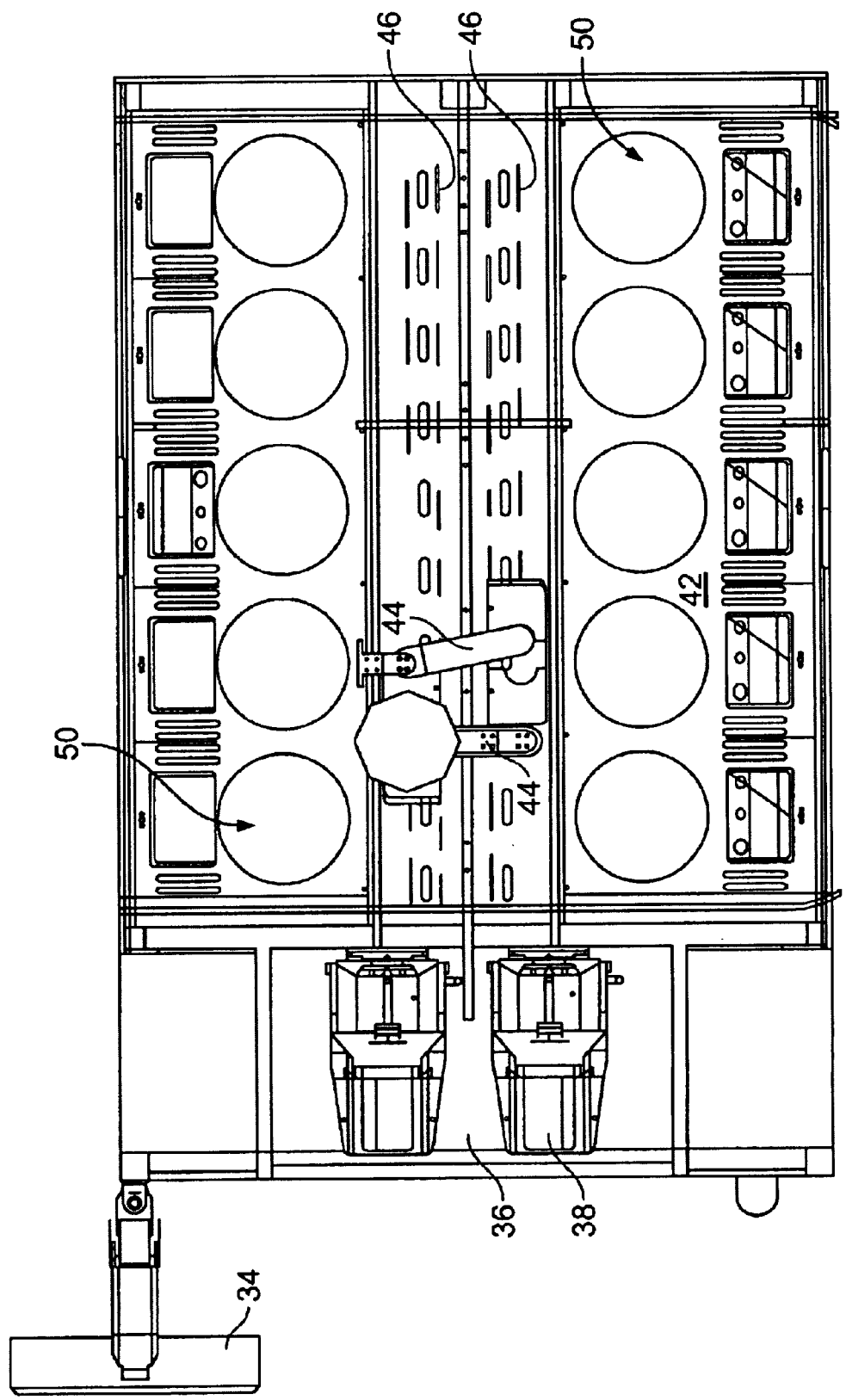
FIG. 2 is a plan view of the system shown in FIG. 1.

Turning to FIG. 2, the processing system 30 preferably includes a frame 42 that supports a plurality of workpiece processors 50 within the enclosure 32. Each workpiece processor 50 may be configured to process workpieces, such as 200 or 300 mm diameter semiconductor wafers provided within sealed boxes 38, open cassettes, or other carriers or containers.

The frame 42 in FIG. 2 is shown supporting ten workpiece processors 50, but any desired number of processors 50 may be included in the enclosure 32. The frame 42 preferably includes a centrally located, longitudinally oriented path 46 between the processors 50. One or more robots 44 preferably move on rails along the path 46 to load and unload workpieces into and out of the processors 50.

Figure 3:
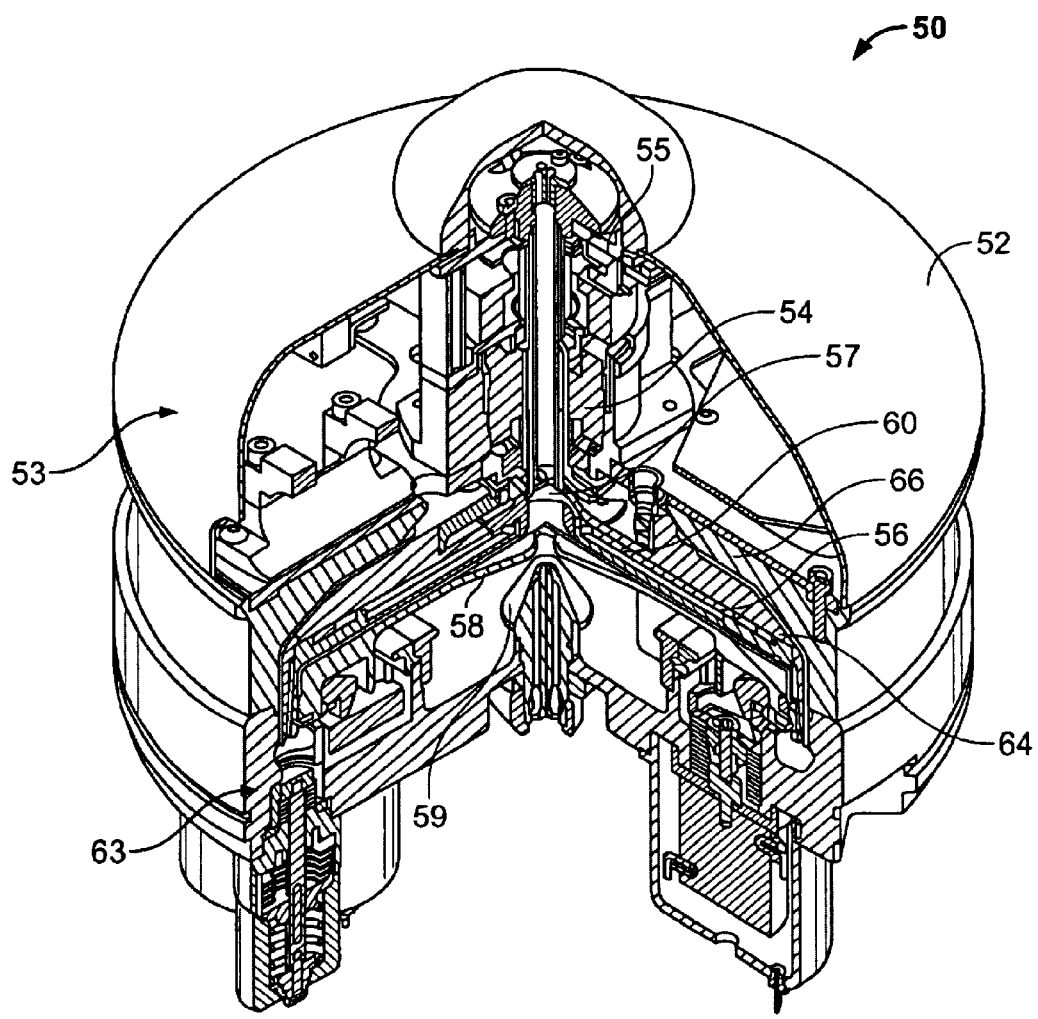
FIG. 3 is a perspective cutaway view of one of the processors shown in FIG. 2.
Figure 4:
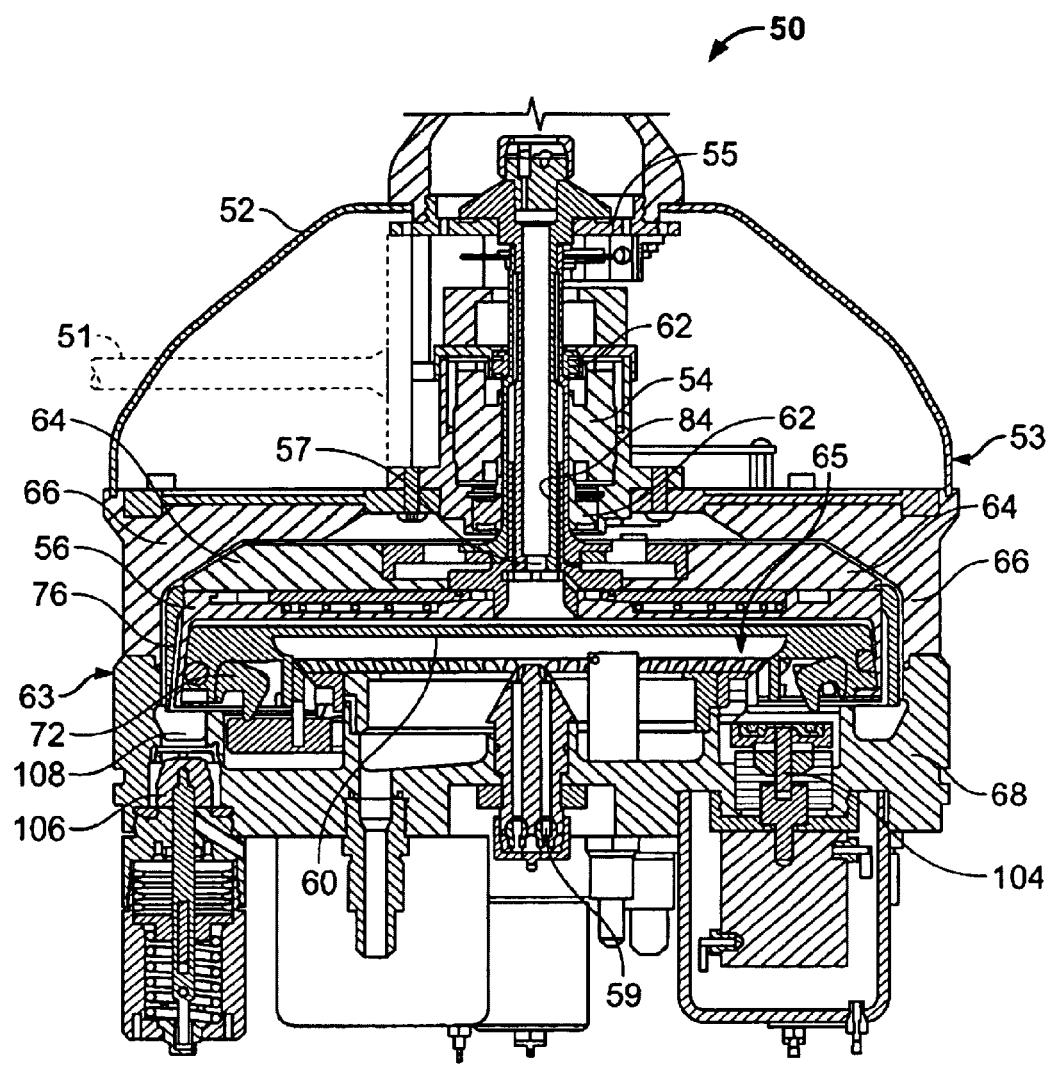
FIG. 4 is a section view of the processor of FIG. 3.
Figure 5:
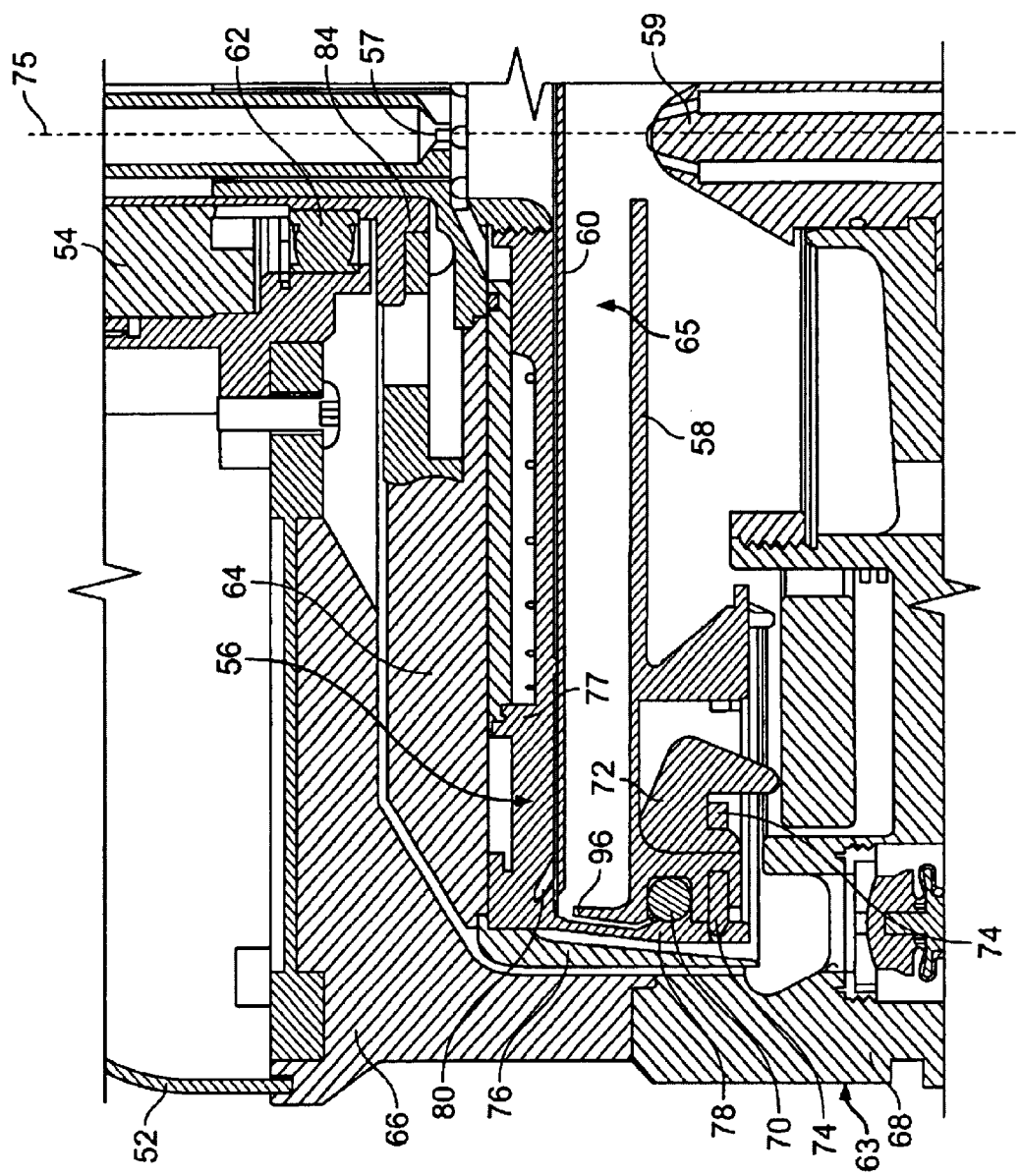
FIG. 5 is an enlarged partial section view of the processor of FIG. 3.

Turning to FIGS. 3–5, each processor 50 includes a head 53 and a base 63. The base is preferably attached to the frame 42 and does not move. The head 53 is supported on an actuator arm 51 (shown in FIG. 4) which lifts and lowers the entire head 53, to engage and separate the head 53 and the base 63. The head 53 includes an upper frame ring 66 that is engageable with a lower frame ring 68 on the base. A cover 52 over the upper frame ring 66 isolates the interior components of the head 53 from the outside environment. An upper rotor 56 in the head 53 is engageable with a lower rotor 58 in the base 63 to form a processing chamber 65 around a workpiece 60. When the head 53 is moved into engagement or contact with the base 63, the upper rotor 56 moves into engagement with the lower rotor 58. As shown in FIG. 5, a seal or o-ring 70 is preferably included between a flange 78 of the upper rotor 56 and the lower rotor 58, to control fluid flow in the processor 50.

Referring to FIG. 5, a first or upper fluid applicator 57 delivers a processing fluid through an opening in the upper rotor 56, preferably to a central region of the upper surface of the workpiece 60. A second or lower fluid applicator 59 in the lower frame ring 68 delivers a processing fluid through an opening 90 in the lower rotor 58, preferably to a central region of the lower surface of the workpiece 60 and/or to an edge region of the workpiece 60, as described below. The first and second fluid applicators 57, 59 may include nozzles, orifices, brushes, pads or other equivalents for applying or delivering processing fluid to the workpiece.

As shown in FIG. 5, one or more drain outlets 80 are preferably located at or near the perimeter or outer edge of the upper rotor 56 for removing processing fluids from the processing chamber 65. Additionally, one or more horizontal weep holes 81 extend through the flange 78. In a preferred embodiment, three spaced apart horizontally oriented weep holes are provided (each having a diameter of about 0.010 to 0.060 or more preferably 0.018 to 0.024 inches) for draining processing fluid trapped between the flange 78 and the lower rotor 58, above the seal 70.

As shown in FIGS. 3 and 4, a motor 54 in the head 53 preferably includes a motor plate 64 attached to the upper rotor 56. A skirt 76 projects downwardly from the motor plate 64 and isolates the processing chamber from the upper and lower frame rings 66, 68. The motor 54 rotates the motor plate 64, and in turn, the upper rotor 56, via an axle 84 positioned around the first fluid applicator 57. When the upper rotor 56 is engaged with the lower rotor 58, the two rotors 56, 58 rotate together. The first fluid applicator 57 is supported on the motor housing 55 and does not rotate with the upper rotor 56. The axle 84 is supported on bearings 62 to allow rotation of the axle 84, the motor plate 64, and the upper and lower rotors 56, 58 about a vertical spin axis 75.

Turning to FIGS. 6–10 and 21, the upper rotor 56 includes a plurality of downwardly projecting alignment pins 100. Each alignment pin 100 preferably includes a tapered leading end. The alignment pins 100 are preferably located at least partially around a periphery of the upper rotor 56 and are positioned so that each alignment pin 100 restricts lateral motion of the workpiece to maintain the workpiece in a centered orientation. The alignment pins are located with tight dimensional tolerances on a circle concentric with the spin axis 75 or the axle 84. As a result, the alignment pins 100 center the workpiece 60 in the processing chamber so that the workpiece 60 is concentric with the spin axis 75, within a known small tolerance.

Turning to FIGS. 11–15, a pair of spaced apart shoulders 92 are positioned at the outer edges of the lower rotor 58. The shoulder 92 includes pin receiving surfaces, such as a groove or slot 94, or in the form of individual holes, for receiving the tapered leading end of an alignment pin 100. The slot 94 is preferably tapered to correspond to the tapered leading end of the alignment pin 100.

Figure 9:
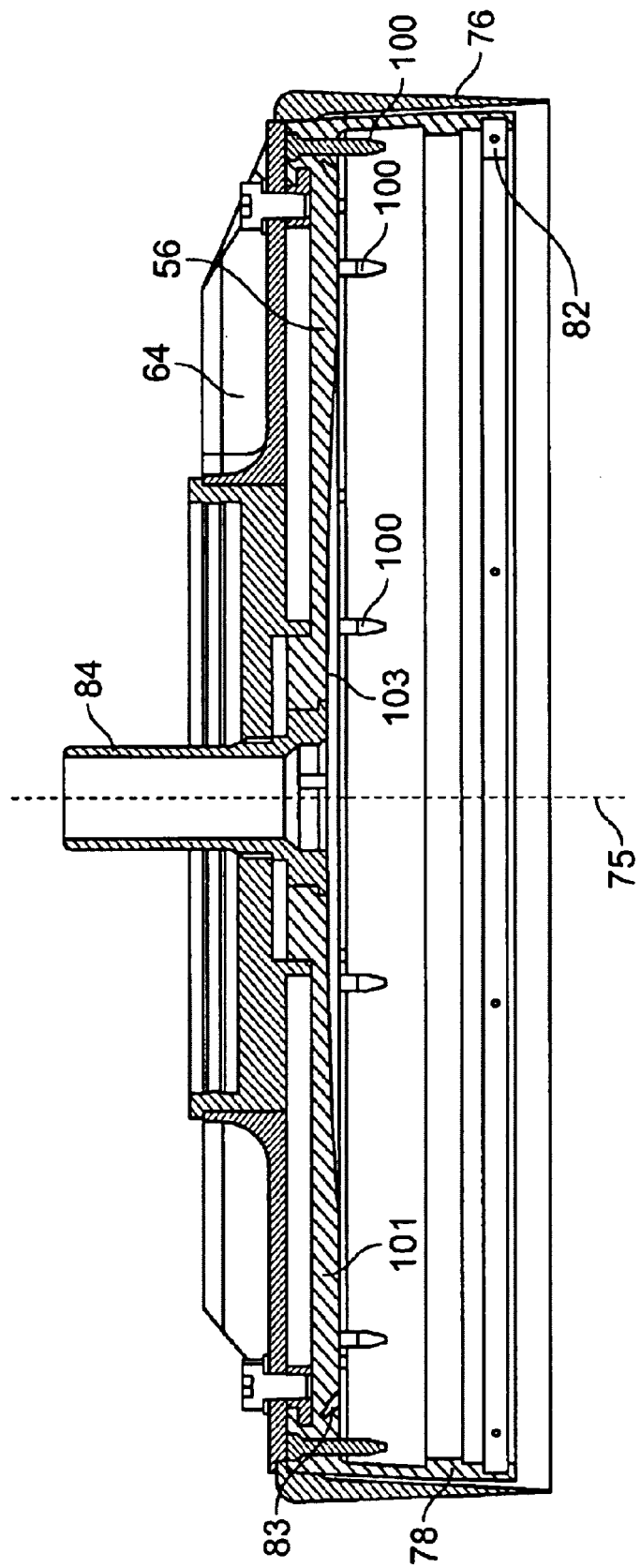
FIG. 9 is a section view taken along line 7—7 of FIG. 6, and showing only the upper rotor, for purpose of illustration.
Figure 10:
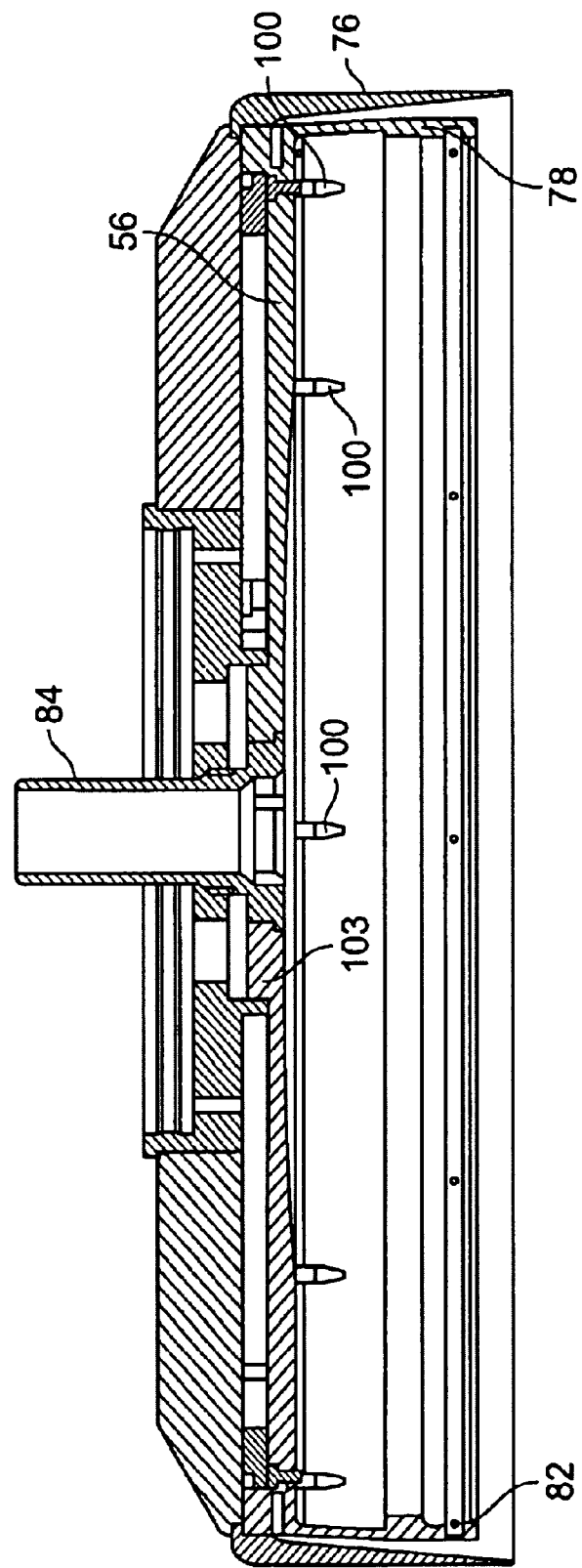
FIG. 10 is a section view taken along line 8—8 of FIG. 6 and showing only the upper rotor, for purpose of illustration.
Figure 11:
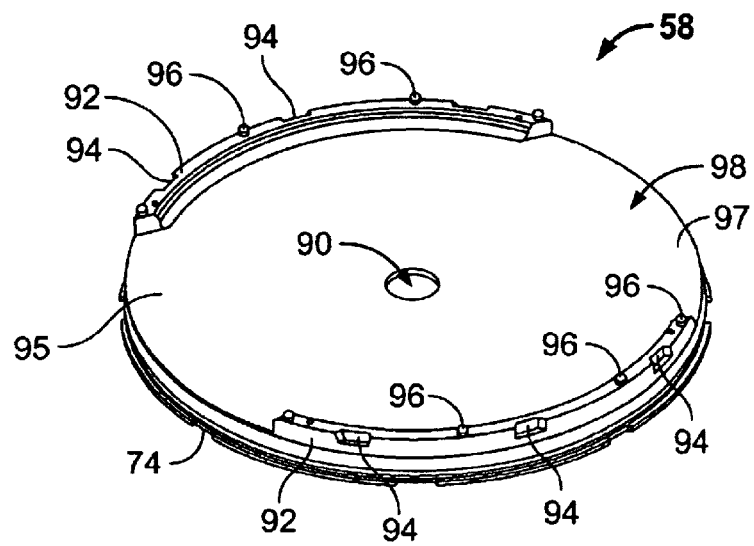
FIG. 11 is top perspective view of the lower rotor of the processor of FIG. 3.
Figure 13:
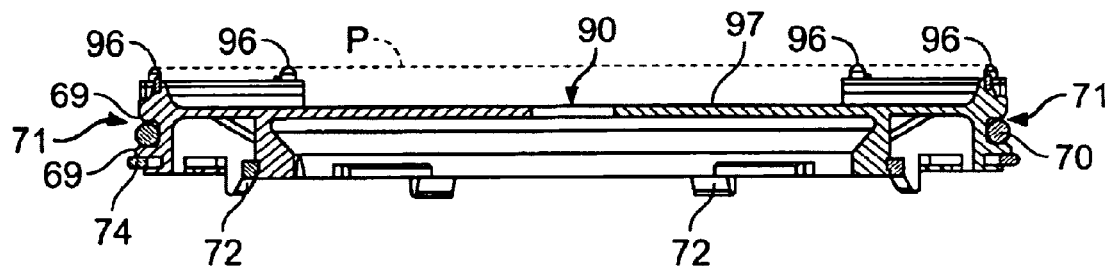
FIG. 13 is a section view of the lower rotor of FIGS. 11 and 12.
Figure 14:
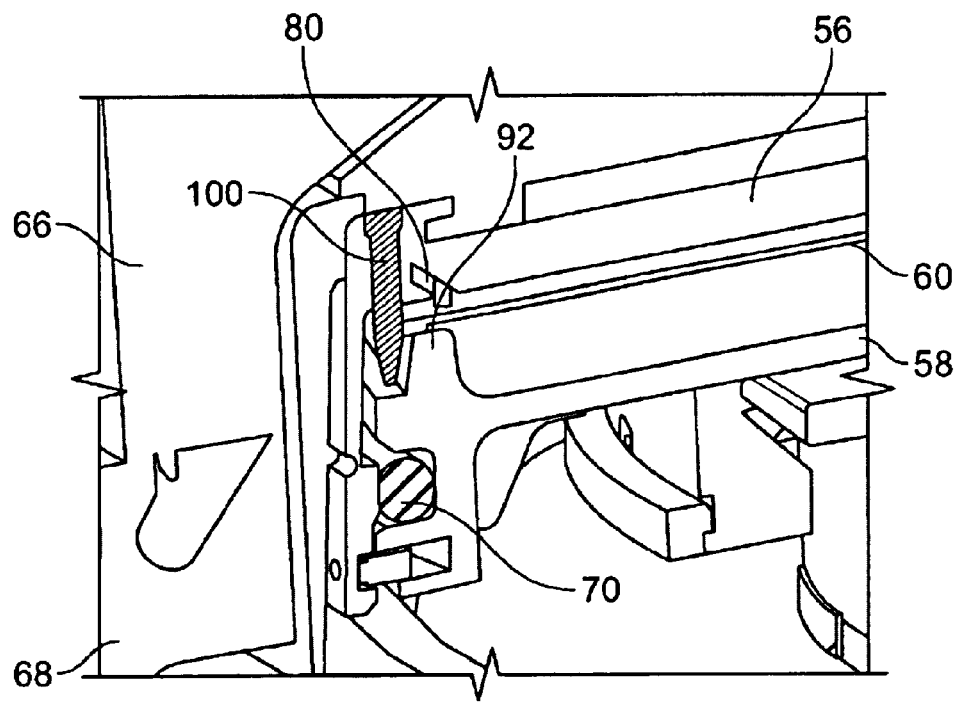
FIG. 14 is an enlarged partial section view of the upper rotor engaged with lower rotor, in the processor of FIG. 3, and showing a workpiece alignment pin.

Each shoulder 92 on the lower rotor 58 preferably includes upwardly projecting lower workpiece support pins 96 for supporting the workpiece 60 and for spacing the workpiece 60 from the interior face or surface 95 of the lower rotor 58, shown in FIG. 11. The shoulders 92 are preferably spaced apart to provide a loading/unloading slot 98 between them, shown in FIG. 11, for receiving an end effector or other workpiece loading device. Accordingly, an end effector supporting a workpiece 60 may enter the lower rotor 58 through the slot 98 between the shoulders 92, and then set the workpiece 60 onto the lower support pins 96, when the processor 50 is in the open position. As shown in FIGS. 3, 11 and 13, the pins 96 on the shoulders 92 support the workpiece or wafer 60 in a plane P (shown in dotted line in FIG. 13) above the surface 95 of the lower rotor. The lower surface of the workpiece or wafer 60 is therefore spaced vertically apart from the surface 95 by e.g. from 2–10 or 4–6 mm. This allows the end effector of the robot to move in under the workpiece, for loading or unloading the workpiece into the processor. In contrast, as shown in FIG. 5, the spacing between the lower interior surface 101 (FIG. 9) of the upper rotor 56 and the workpiece 60 is much less, typically 1, 2, 3 or 4 mm (when the processor is closed or in the process position). As also shown in FIG. 9, the surface 101 of the upper rotor has a slightly conically tapered section 103, running at an angle of 2–8 or 4–6 degrees.

Figure 15:
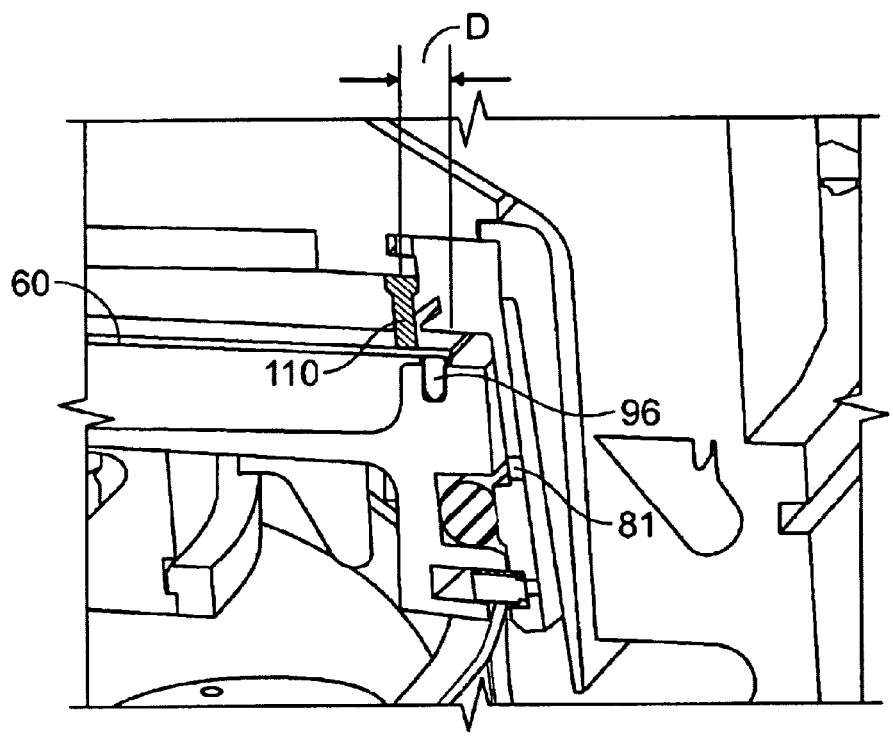
FIG. 15 is an enlarged partial section view of the upper rotor engaged with the lower rotor of the processor of FIG. 3, and showing an upper workpiece support pin.
Figure 21:
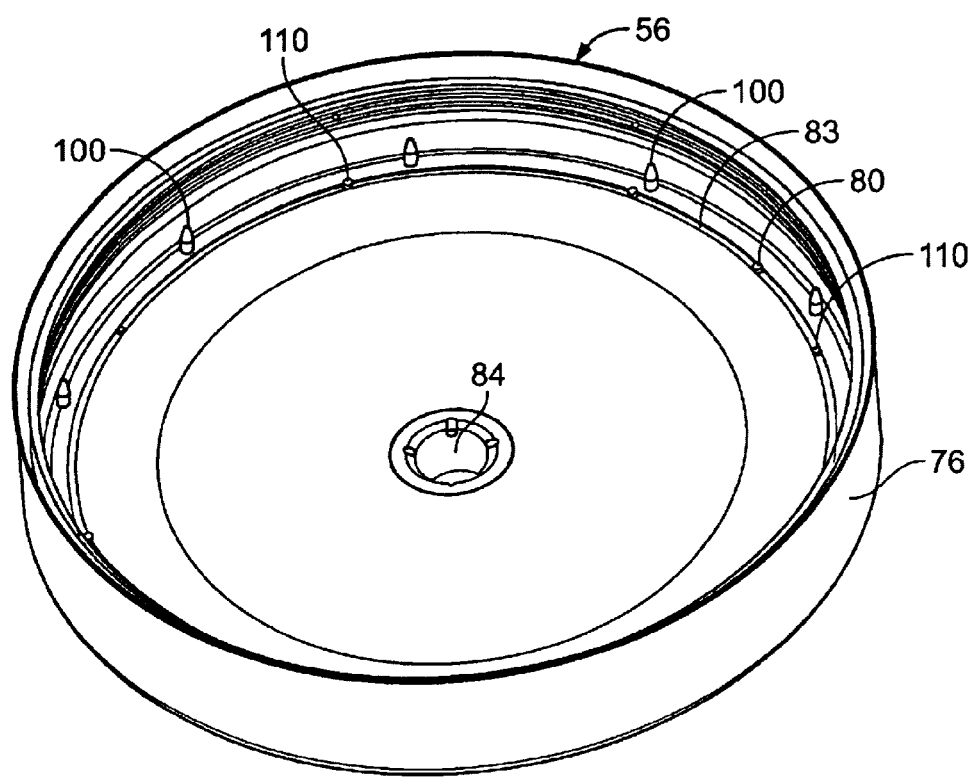
FIG. 21 is a perspective view of the inside of the upper rotor shown in FIG. 6.

Referring to FIGS. 15 and 21, the upper rotor 56 preferably includes downwardly projecting upper workpiece support pins 110 for holding the workpiece 60 against the lower support pins 96. A drain groove 83 in the upper rotor, as shown in FIG. 21, sets the radially inward limit of travel for liquid process chemicals during edge wrap processing. The drain outlets 80 extend through the upper rotor 56, radially outwardly from the drain groove. The pins 110 are located at least 1, 2, 3, 4, 5 or 6 mm radially inwardly from the outer perimeter or edge of the drain groove 83. As shown in FIG. 21, at the lower ranges of inward spacing, e.g., 2 or 3 mm, the pins 110 are at least partially located in the drain groove 83. By positioning the upper support pins 110 radially inside of the outer edge of the drain groove 83, the pins 110 are outside of the fluid flow path during edge processing of the workpiece 60, as described below. Thus, spots of residual metal (e.g., copper plating) that may result from upper support pins positioned closer to the perimeter of the workpiece, and therefore in the fluid path, are avoided.

As shown in FIGS. 5–8, the shaft or axle 84 of the motor 54 connects directly to the motor plate 64 on the upper rotor assembly, via a shaft 73. Consequently, as there is a more direct connection between the shaft 84, which defines the spin axis, and the pins 100, which position the workpiece. In contrast to earlier designs, spin concentricity is improved (to about ±0.5 mm or better). In earlier designs where the workpiece is positioned by pins or other features on the lower rotor, the accumulation of dimensional tolerances can result in significant eccentricity (e.g. ±0.9 mm) between the spin axis and the workpiece.

Figure 12:
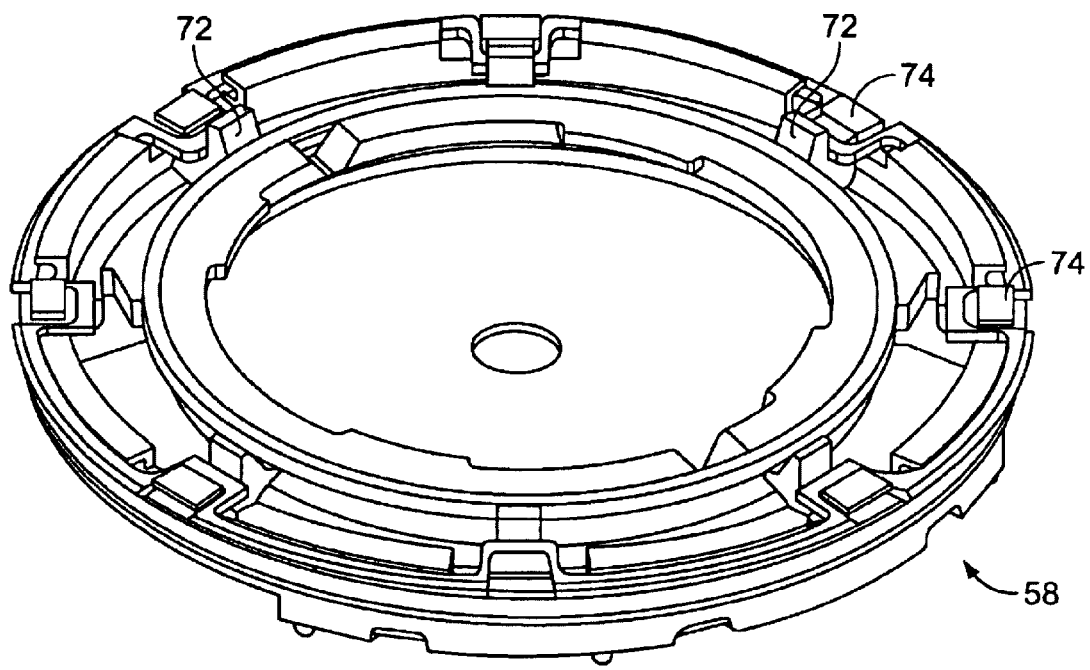
FIG. 12 is bottom perspective view of the lower rotor of FIG. 11.

As shown in FIG. 5, the upper rotor 56 has a liner or chamber plate 77 preferably made of a corrosion resistant material, such as Teflon (Fluoropolymer resins). The chamber plate is attached to the motor plate 64. The motor plate 64 and other components in the head 53 are typically metal, such as stainless steel. The lower rotor, as shown in FIGS. 11–13, will also typically be made of a corrosion resistant material or plastic, such as Teflon or PVDF. This allows the processor 50 to better resist corrosion caused by highly reactive gases or liquids, such as acids, used in processing. The pins 100, shown in FIGS. 7–10, are secured into the motor plate 64 and pass through the chamber plate 77. Typically 10 pins 100 are evenly spaced apart on the upper rotor, although more or less pins may be used.

Referring to FIGS. 3–6, on or in the head 53, the cover 52; motor housing 55; motor 54, fluid applicator 57 and upper frame ring 66, are fixed in place and do not rotate (although they can lift up vertically). The shaft or axle 84 (which is connected to or forms part of the motor shaft); shaft end 73; motor plate 64 including the flange 78, the skirt 76 and the liner plate 77, all rotate together when the motor 54 is turned on.

Referring to FIG. 4. in or on the base 63, the lower frame ring 68; drain 108; valve 106; cam actuator 104; and the fluid applicator or nozzle 59, are preferably fixed in place, and do not rotate. The lower rotor 58 including the seal 70, cams 72, latch ring 74 and other attached components shown in FIGS. 11–13, rotate with the lower rotor, when the lower rotor is engaged with and driven by the upper rotor.

Figure 16:
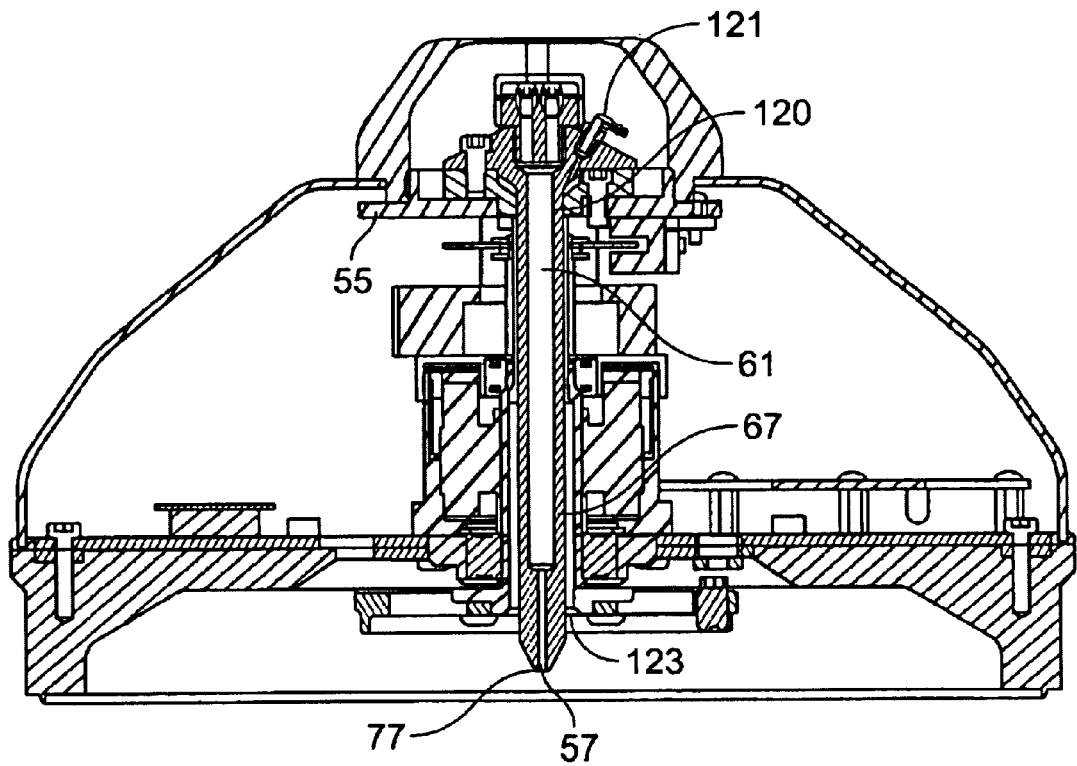
FIG. 16 is a section view of the head of the processor shown in FIG. 3, with the upper rotor removed for purpose of illustration.
Figure 17:
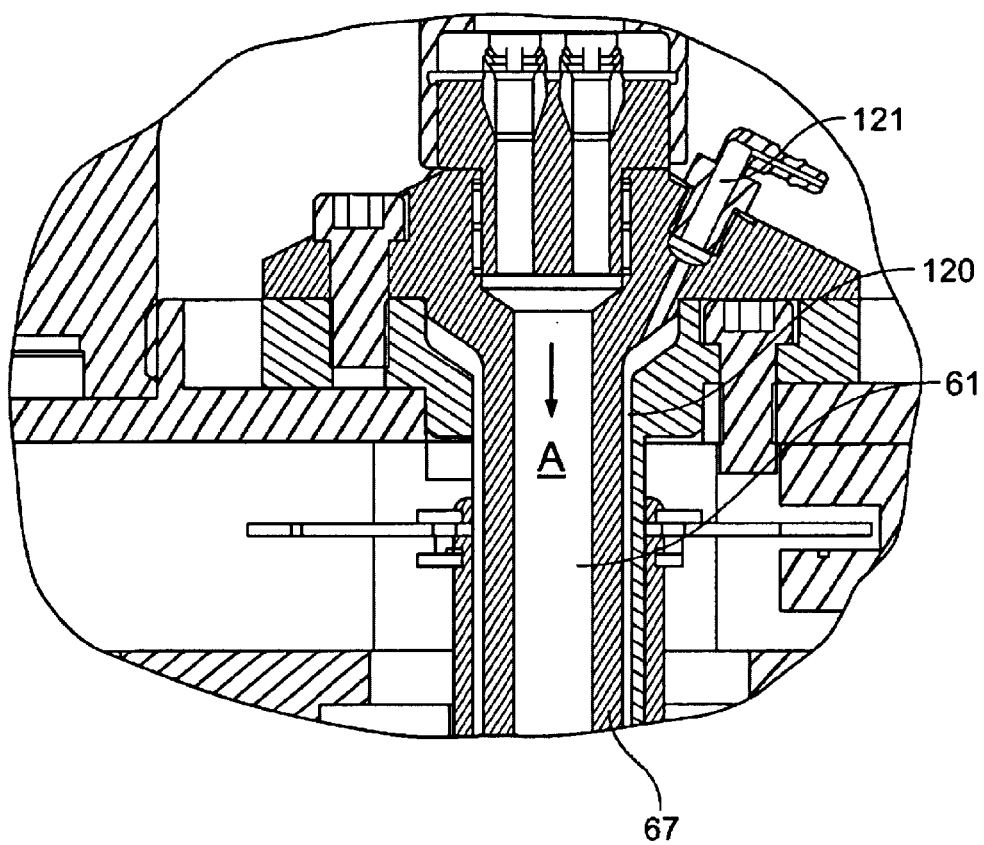
FIG. 17 is an enlarged section view of the purge gas manifold in the head shown in FIG. 16.

Turning to FIGS. 16 and 17, an annular opening 120 is provided around a fluid delivery manifold 67 forming the first fluid applicator, nozzle or outlet 57, as well as around a liquid delivery path 61 leading to the first fluid outlet 57. The manifold 67 is fixed in position on the head 53. Consequently, the lower end or tip 77 of the first fluid outlet 57 is at a fixed pre-determined position above the wafer 60. This avoids the need for adjustment of the outlet 57. Purge gas, such as $N_2$ gas, is supplied from an inlet 121 into the annular opening 120. Ambient air can also flow down through the annular opening 120. The annular opening 120 extends down from the inlet into the processing chamber. By delivering a purge gas into the processing chamber via the annular opening 120, uniform delivery of the purge gas into the processing chamber is achieved, providing more uniform and consistent processing. The lower end or tip 77 of the outlet 57 is below the lower end 123 of the annular opening 120 by a fixed dimension. This helps to reduce splattering or unintended movement of liquid, since the gas is introduced further away from the liquid. The fixed placement of the manifold 67 and the liquid and gas outlet locations 57 and 123 (which are set at the factory during assembly) helps to provide consistent and repeatable wafer processing.

Figure 6:
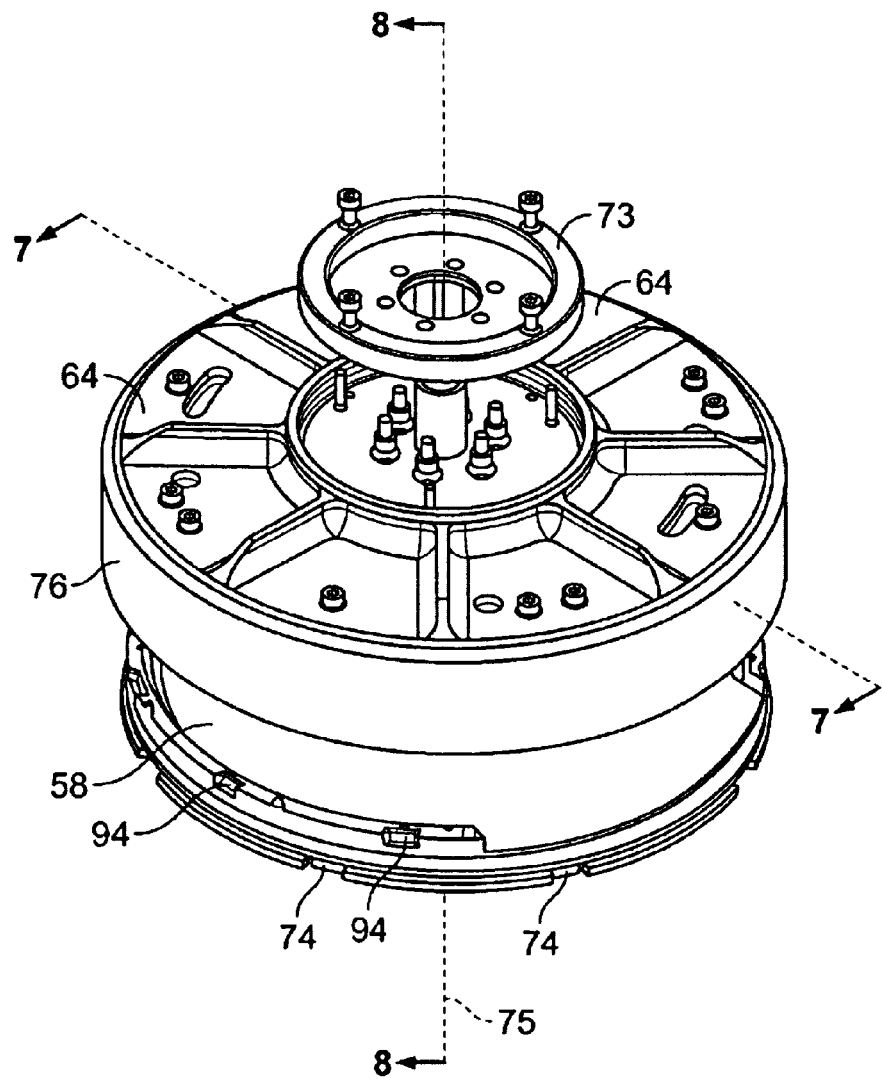
FIG. 6 is an exploded perspective view of the processor of FIG. 3.

Referring again to FIGS. 1 and 2, in use, a pod, cassette, or container 38 is moved onto the input/output station 36. If the container is sealed, such as a FOUP or FOSBY container, the container door is removed, via robotic actuators in the system 30. A robot 44 then removes a workpiece 60 from the container 38, places the workpiece into a processor, and sets the workpiece 60 onto the lower support pins 96 of the lower rotor 58. As shown in FIGS. 5 and 6, to place the workpiece 60 onto the lower support pins 96, the robot moves an end effector, or similar device supporting the workpiece 60, through the loading/unloading slot 98 in the lower rotor 58, and lowers the workpiece 60 onto the lower support pins 96. The robot 44 then withdraws the end effector from the processor 50. While the processor 50 could alternatively be provided as a stand alone manually loaded system (without the input/output station 36, the robots 44, or the enclosure 32), the automated system shown in FIGS. 1 and 2 is preferred.

Figure 8:
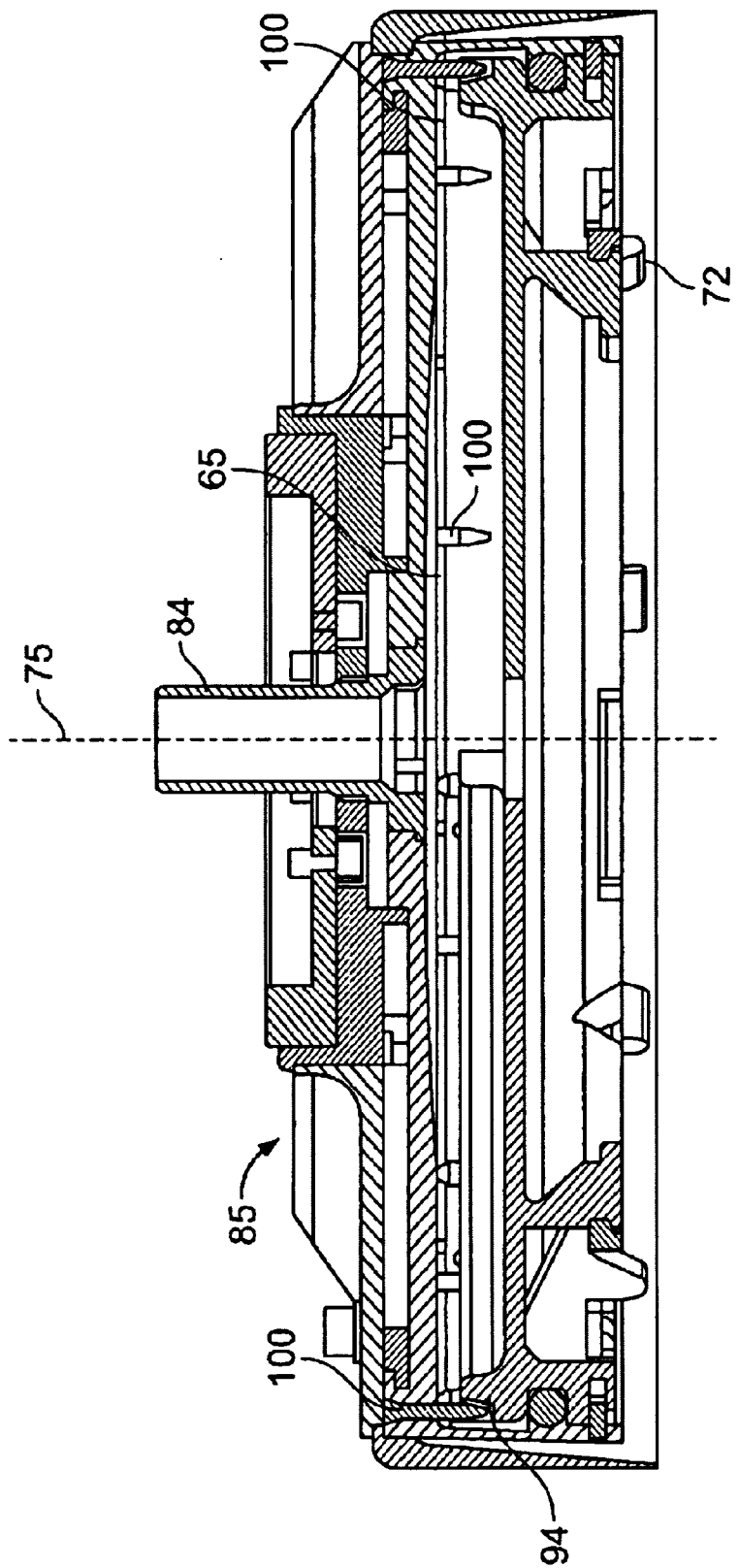
FIG. 8 is a section view taken along line 8—8 of FIG. 6.

Referring to FIGS. 4, 5 and 8, the upper and lower rotors are then brought together into engagement with each other, preferably by lowering the head 53 down into contact with the base 63. As this occurs, the upper rotor 56 is lowered down toward the lower rotor 58. The tapered leading ends of the alignment pins 100 on the upper rotor 56 move into the tapered openings or slot 94 in the lower rotor 58 to center the workpiece with the drain groove 83 in the upper rotor and to form the processing chamber 65 around the workpiece 60. The inner edge of the tapered portion of each alignment pin 100 preferably contacts the edge of the workpiece 60 to center the workpiece 60 within the processing chamber. As a result, the workpiece 60 is positioned concentrically with the vertical spin axis 75 of the processing chamber and with the drain groove 83. This helps to provide uniform and efficient processing, particularly edge processing, of the workpiece 60.

Figure 7:
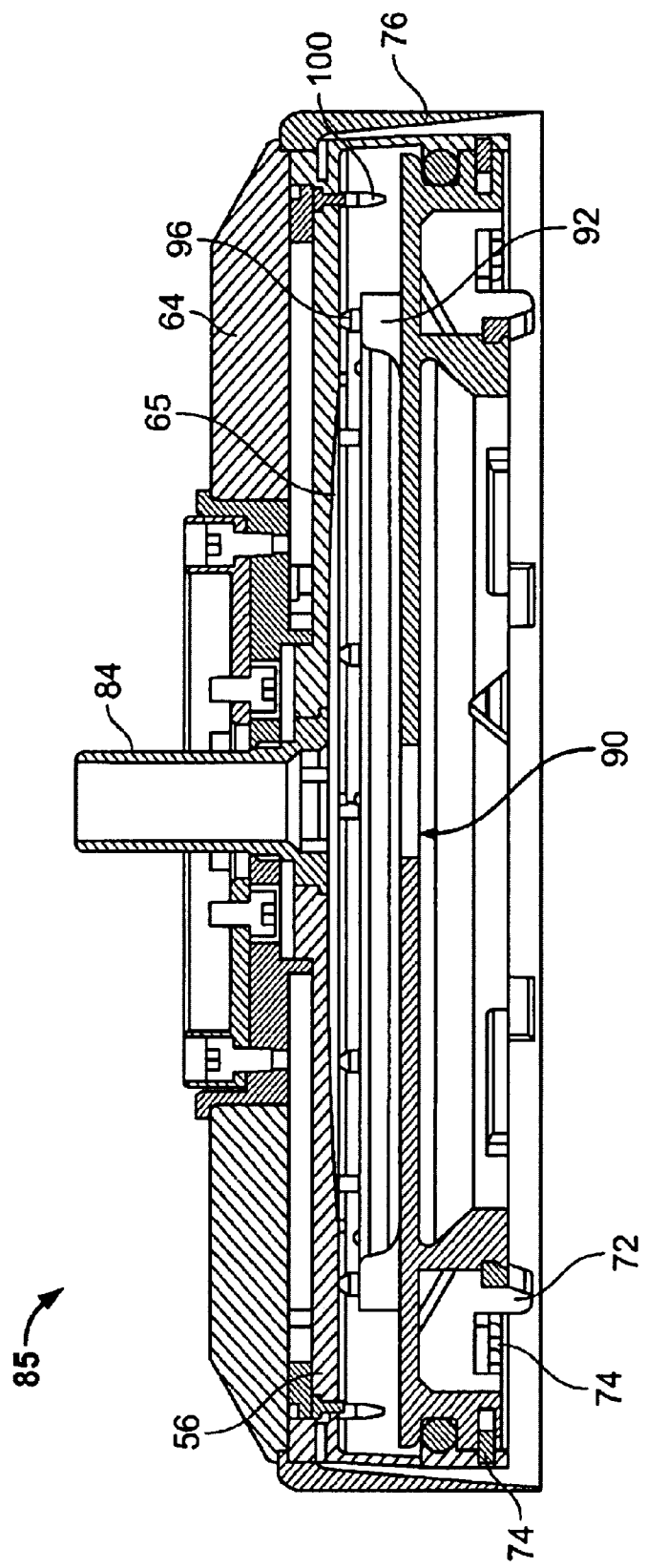
FIG. 7 is a section view taken along line 7—7 of FIG. 6.

When the upper rotor 56 is lowered into engagement with the lower rotor 58, the upper support pins 110 on the upper rotor 56 closely approach or contact the upper surface of the workpiece 60 to secure or confine the workpiece 60 within the processing chamber. Turning to FIGS. 3, 4 and 5, after the rotors are brought together, cam actuators 104 in the base 63 move down, causing cams 72 to pivot and release sections of a latch ring 74. The latch ring sections then move radially outwardly and into grooves 82 in the flange 78 of the upper rotor. This operation is described in U.S. Pat. No. 6,423,642, incorporated herein by reference. The lower rotor 58 is thus secured to the upper rotor 56 to form a combined rotor unit or assembly 85 (FIGS. 7 and 8).

Once the processor 50 is in the closed or processing position, a processing fluid is supplied via one or both of the first and second fluid applicators 57, 59 to the upper and/or lower surfaces of the workpiece 60. The rotor unit 85 is rotated by the motor 54. Centrifugal force creates a continuous flow of fluid across the surfaces of the workpiece 60. Processing fluid moves across the workpiece surfaces in a direction radially outward from the center of the workpiece 60 to the edges of the workpiece 60.

At the perimeter of the processing chamber 65, used processing fluid moves out of the processing chamber through the drain outlets 80 and/or other weep holes 81 or drain paths in the upper and/or lower rotors 56, 58, due to the centrifugal force. The used fluid collects in a drain area 108 shown in FIGS. 4 and 5 and may be delivered to a recycling system for reuse, or to a disposal area for proper disposal, by opening a valve 106.

When the step of processing with the first processing fluid is completed, a purge gas, such as $N_2$ gas, is preferably delivered into the processing chamber 65 to help remove any remaining processing fluid from the chamber. The purge gas is preferably delivered from the purge gas inlet 122 into the annular opening 120 around the first fluid applicator 57. The purge gas continues through the annular opening 120 into the processing chamber 65. Accordingly, the purge gas is delivered into the processing chamber in the form of an annular ring of gas, which facilitates uniform dispersion of the purge gas throughout the processing chamber. As a result, processing fluids are more effectively and efficiently removed from the processing chamber.

Once the first processing fluid is removed from the processing chamber, similar processing and purging steps may be performed for one or more additional processing fluids. A rinsing step, preferably using a deionized (DI) rinse water, may be performed after each processing step, or may be performed after all of the processing steps are completed. A drying step, performed with isopropyl alcohol (IPA) vapor or another drying fluid, may be performed after the final processing or rinsing step.

Once processing has been completed, head 53 is lifted or separated from the base 63 to allow access to the workpiece 60. In this open position, the workpiece 60 may be removed from the processing chamber by the robot 44, and another workpiece may be placed into the processing chamber by the same robot 44, or by another robot.

Figure 18:
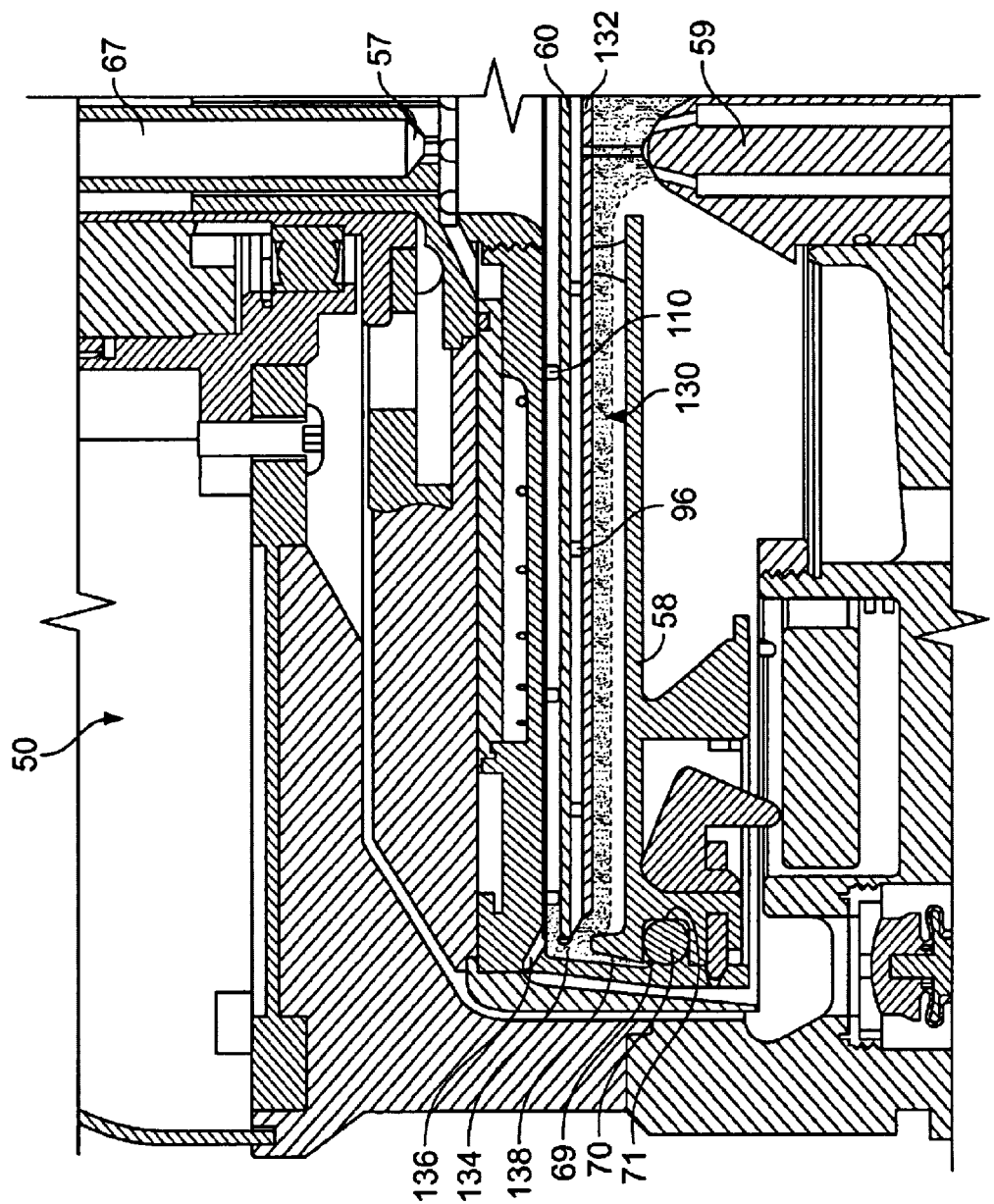
FIG. 18 is a partial section view of an alternative embodiment processor having a shield plate for directing a processing fluid to the edge of a workpiece in the processing chamber.
Figure 19:
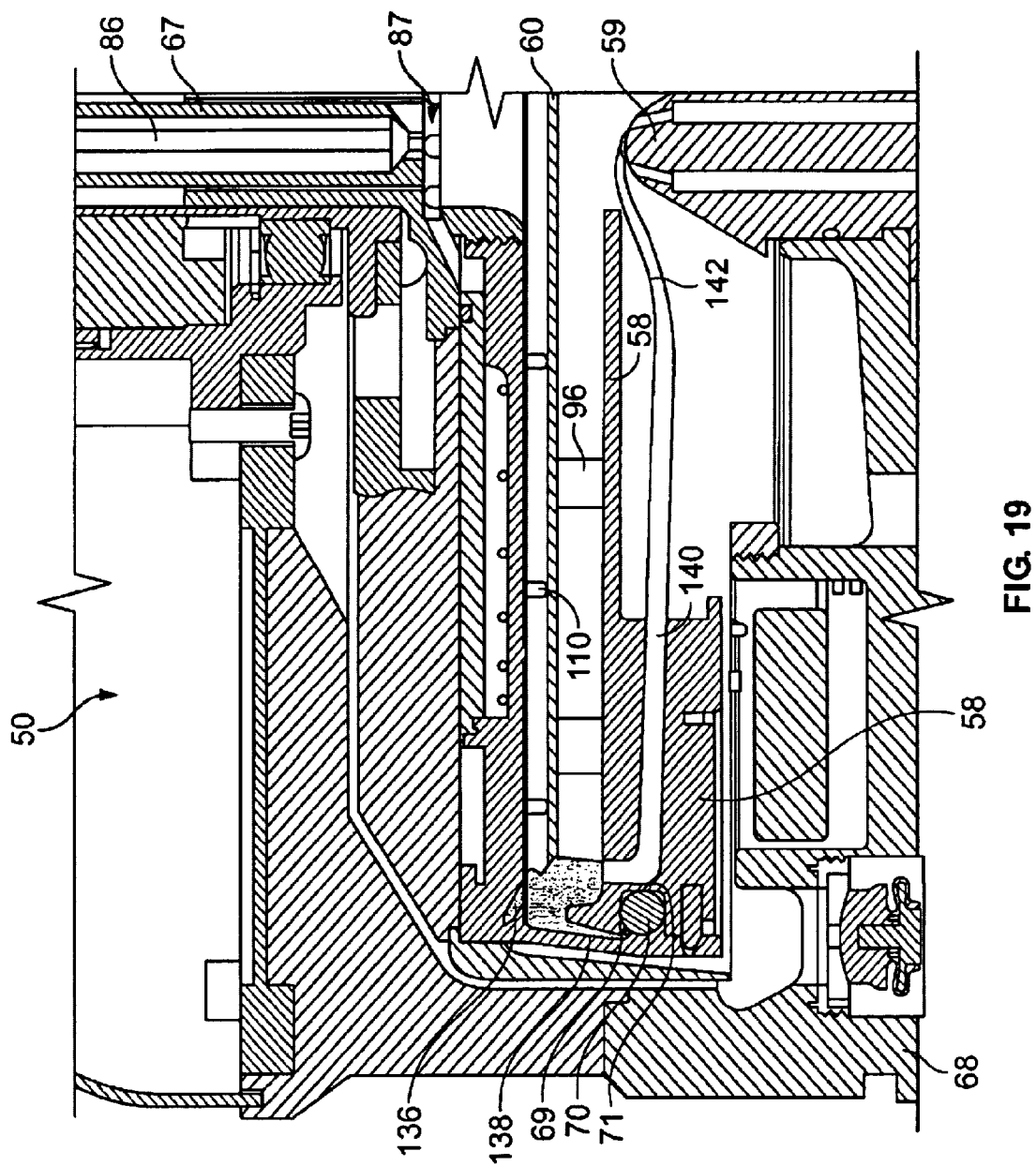
FIG. 19 is a partial section view of a processor having a fluid delivery path for delivering a processing fluid directly to the edge of a workpiece in the processing chamber.

Turning to FIGS. 18 and 19, two alternative embodiments of the processor 50 that may be used for edge processing of a workpiece 60 are illustrated. In these embodiments, a fluid delivery path is provided for directing processing fluid to an edge of the workpiece 60 so that edge processing may be performed. In these embodiments, processing fluid may be supplied via the second fluid applicator 59, or via a separate fluid delivery device.

Referring to FIG. 18, a lower fluid delivery path 130 is formed between a shield plate 132 and the interior face of the lower rotor 58. The shield plate 132 is co-axial with the round workpiece 60 and has a diameter preferably about 2–12, 4–10, or 5–8 mm less than the workpiece. Processing fluid is provided toward the center of the lower surface of the shield plate and directed radially outwardly along the shield plate 132 via centrifugal force. The fluid flows off of the circumferential edges of the shield plate, and onto the outer edges of the workpiece 60. As a result, only the edge of the workpiece 60 is processed.

In the embodiment illustrated in FIG. 19, a fluid delivery path 140 is provided from the second fluid applicator 59 (or other fluid source) directly to the edge of the workpiece 60. Thus, processing fluid enters the processing chamber directly at the edge of the workpiece 60, as opposed to entering toward the center of the workpiece 60 and being guided toward the edge of the workpiece with a shield plate 132. The fluid delivery path 140 may include a fluid delivery line 142, or may simply be one or more paths or bores in the lower rotor 58.

If processing of the lower surface of the workpiece 60 is also desired in the embodiment shown in FIG. 19, a valve or a similar device may be located in the second fluid applicator 59 to selectively direct fluid to the fluid delivery path 140, and to the center of the workpiece 60. In one embodiment, the fluid delivery path 140 may be connected to the second fluid applicator 59 by a rotary union, or a similar device, so that the fluid delivery path 140 may rotate while the second fluid applicator 59 remains stationary.

In the embodiments illustrated in FIGS. 18 and 19, drain holes 136 in the upper rotor 56, and a drain path 138 in the lower rotor 58, allow the processing fluid to escape from the processing chamber. A purge gas, such as $N_2$ gas, is preferably directed radially outwardly above the workpiece 60 during processing to aid in directing the processing fluid out through the drain holes 136, so that the processing fluid does not contact the inner or central surfaces of the workpiece 60. As shown in FIG. 19, a fluid delivery tube 86, typically for DI water, extends down through the opening or path 61 in the manifold 67. The tube 86 ends flush with the lower end of the manifold 67. With the tube 86 flush, dripping is reduced, as compared to having the tube 86 recessed or protruding, even slightly, from the manifold 67.

As shown in FIGS. 18 and 19, the seal 70 is positioned in a groove or channel 71 around the outside of the lower rotor 58. A chamfer 69 at the edge of the groove 71 helps to reduce or prevent droplets of fluid from clinging too the upper rotor during separation, and subsequently falling onto the workpiece and causing potential damage or contamination. As shown in FIG. 13, the edges of the groove 71 may alternatively be rounded or radiused.

Referring still to FIGS. 18 and 19, the processor 50 uses improved air and gas flow designs, which dramatically speed up workpiece drying. This reduces required processing times and increases manufacturing efficiency or throughput. During drying, clean dry air (which may be filtered and/or heated) flows down through the opening 67, due to the low pressure zone created around the center of the processor via the spinning movement. This air, shown by arrow A in FIG. 17, impinges on the top surface of the workpiece and then flows outwardly. If (nitrogen) gas is also used during drying, then the air mixes with the gas flowing from the annular opening 120. The air and gas then flows out through the drain holes. In comparison to earlier designs requiring e.g., 60 seconds for drying, the processor shown in FIG. 16 dries a workpiece in about 20 seconds.

The processor components in the processing system 30 may be made of any suitable material, such as Teflon® (synthetic fluorine-containing resins) or stainless steel. Any processing fluids typically used to process workpieces, such as semiconductor wafers, may be used in the processing system 30. For example, aqueous or gaseous ozone, aqueous or gaseous HF or HCL, ammonia, nitrogen gas, IPA vapor, DI rinse water, $H_2SO_4$, mixed acids, acids with oxidizers or bases with oxidizers, solvents, etc. may be used to perform the various processing steps. In applications where harsh acids or solvents are used, such as HF or $H_2SO_4$, it is preferable to use Teflon® components so that the rotor components are not damaged by the processing chemistries. Preferably, the first and second fluid applicators or outlets 57, 59 are connected with, and have separate outlets for, DI water, clean dry air, nitrogen, and one or more of the liquid process chemicals listed above. One or more valves may be used to control the flow of liquids and gases through the first and second fluid applicators 57, 59.

Additional system components, such as an IPA vaporizer, a DI water supply, heating elements, flowmeters, flow regulators/temperature sensors, valve mechanisms, etc. may also be included in the processing system 30, as is common in existing systems. All of the various components of the processing system 30 may be under the control of a controller unit 34, shown in FIG. 1, having appropriate software programming.

While the rotors, workpieces, and other components are described as having diameters, they can also have non-circular shapes. The workpiece processing systems and methods described here provide the following advantages.

(1) By using tapered alignment pins 100 on the upper rotor 56, and a corresponding tapered slot 94 in the lower rotor 58, the workpiece 60 is more precisely centered on the spin axis of the shaft 84 and with the drain groove 83, by the alignment pins 100. Accordingly, eccentric processing is reduced, and more devices may therefore be produced from each workpiece 60. Waste resulting from eccentric workpiece alignment is reduced.

(2) By fixing the positions of the annular opening 120 around the first fluid outlet 57 on the manifold 67, purge gas and/or air can be uniformly delivered to the processing chamber. More consistent processing can therefore be achieved.

(3) By positioning the upper workpiece support pins radially inwardly at least 1, 2, 3, 4, 5 or 6 mm from the outer edge of the drain groove 83 (measured to the pin center), the upper support pins 110 remain out of the flow of processing fluid during edge processing of the workpiece. As a result, residual copper spots or other workpiece contamination caused by contact between the workpiece and the upper support pins is avoided. The pins 110 preferably have a hemispherical or rounded top surface. Test results show that contact between the pins 110 and the plated area inward from the workpiece edge, does not result in any degradation or defects on the workpiece.

(4) By using a shield plate 132 or fluid path 140 to guide processing fluid directly to the edge of the workpiece 60, the edge of the workpiece 60 can be efficiently processed. Additionally, by concurrently supplying a purge gas above the workpiece surface, the processing fluid is effectively removed from the processing chamber without being deposited on the upper surface of the workpiece, thus reducing or eliminating workpiece contamination.

Figure 20:
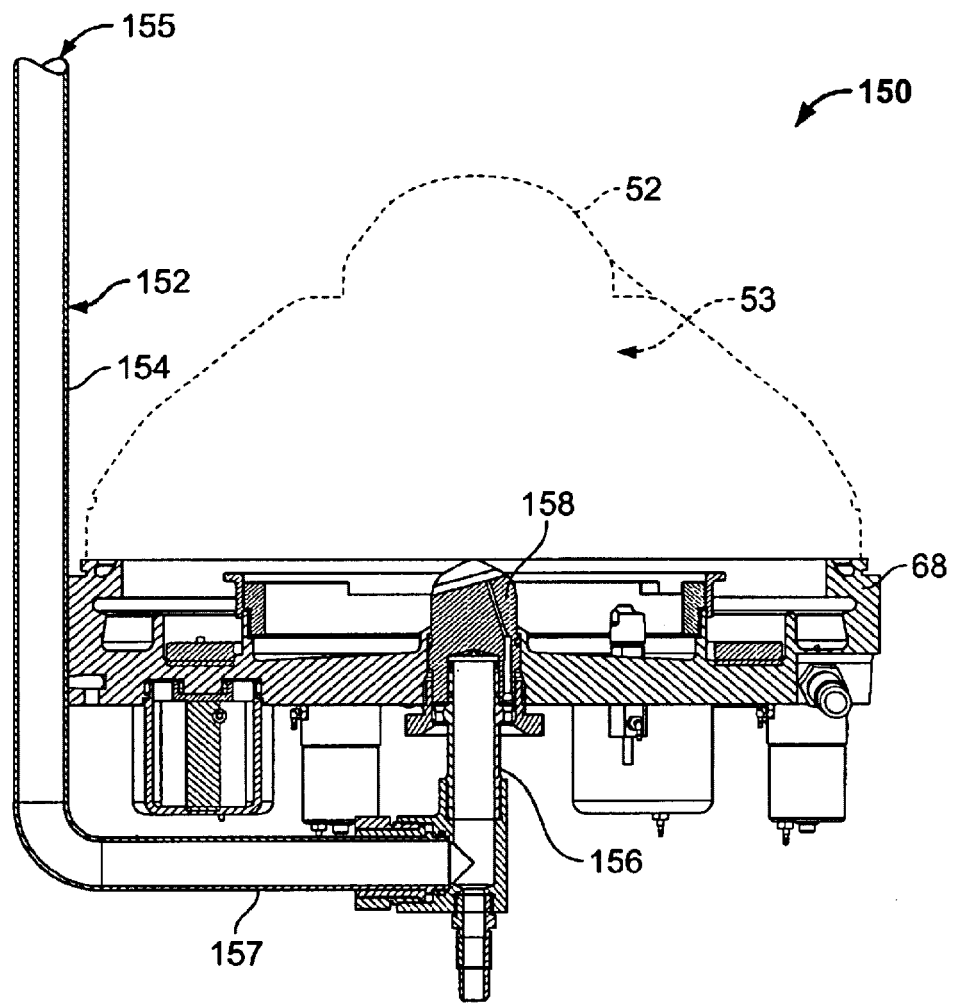
FIG. 20 is a section view of a base of an alternative processor having a lower rotor air inlet.

Turning to FIG. 20, in an alternative processor 150, an air supply line or snorkel 152 has an inlet or opening 155 vertically above the head 53. Typically, the inlet 155 is near the top of the enclosure 32, adjacent to the system air filters 35 shown in FIG. 1. A vertical riser section 154 of the snorkel 152 connects into a horizontal section 157 and into an air pipe 156. The air pipe 156 is joined to a lower nozzle 158 positioned to spray up onto a bottom surface of a workpiece, through an opening in the lower rotor. The lower nozzle 158 preferably has multiple spray outlets, with one or more spray openings connecting to one or more process fluid sources. The snorkel 152 supplies clean air to the bottom surface of the workpiece, when the rotor assembly (the upper rotor 56 joined with the lower rotor 58) spins. The low air pressure adjacent the center of the spinning rotor assembly draws air in through the lower nozzle 158. The air sprays upwardly from the nozzle 158 onto the lower surface of the workpiece. Drying of the lower surface is achieved more quickly.

While embodiments and applications of the present invention have been shown and described, it will be apparent to one skilled in the art that other modifications are possible without departing from the inventive concepts herein. The invention, therefore, is not to be restricted except by the following claims and their equivalents.

What is claimed is:

1. A system for processing a workpiece, comprising:
  a plurality of workpiece processors, with at least one of the workpiece processors comprising:
    a first rotor including a plurality of alignment pins;
    a second rotor including one or more receiving surfaces for receiving the alignment pins, with the first and second rotors forming a workpiece processing chamber when the alignment pins are engaged with the second rotor; and
    a robot moveable between the workpiece processors for loading and unloading the workpiece into and out of one or more of the processors.

2. The system of claim 1 wherein each of the alignment pins includes a tapered leading end, and wherein the receiving surface comprises a tapered opening for receiving the tapered leading ends of the alignment pins.

3. The system of claim 1 wherein the alignment pins are positioned at least partially around a periphery of the first rotor such that an inner surface of each of the alignment pins contacts or closely contains an edge of the workpiece to align the workpiece within the processing chamber.

4. The system of claim 1 further comprising a plurality of support pins on at least one of the first rotor and the second rotor for contacting at least one of an upper surface and a lower surface of a workpiece located in the processing chamber.

5. The system of claim 4 wherein the support pins are positioned to contact the workpiece at locations outside of a fluid path used for processing an edge of the workpiece.

6. The system of claim 5 further comprising a drain groove in the first rotor, and wherein the support pins are positioned at least 3 mm radially inwardly from an outer edge of the drain groove.

7. The system of claim 1 wherein the receiving surface on the second rotor comprises a plurality of holes in the lower rotor.

8. The system of claim 1 further comprising a plurality of horizontally oriented weep holes in the first rotor for removing processing fluid from the processing chamber.

9. The system of claim 8 wherein the first rotor is an upper rotor, on top of the second rotor.

10. The system of claim 1 wherein the receiving surface comprises a tapered wall on the second rotor.

11. The system of claim 1 further comprising a fluid applicator in the first rotor for delivering a processing fluid to a central region of the workpiece.

12. The system of claim 11 wherein the fluid applicator comprises a spray nozzle.

13. The system of claim 1 further comprising a fluid delivery path extending through at least one of the first rotor and the second rotor and terminating adjacent a circumferential outer edge of the rotor.

14. A system for processing a workpiece, comprising:
  a plurality of workpiece processors, with at least one of the workpiece processors comprising:
    a first rotor;
    a second rotor engageable with the first rotor to form a workpiece processing chamber;
    a fluid applicator for delivering a processing fluid to a central portion of a workpiece located in the processing chamber;
    a substantially annular opening around an outer periphery of the fluid applicator;
    a purge gas source for delivering a purge gas through the annular opening into the processing chamber; and
    a robot moveable between the workpiece processors for loading and unloading the workpiece into and out of one or more of the processors.

15. The system of claim 14 further including a fluid delivery tube within the fluid applicator and terminating flush with a lower end of the fluid applicator.

16. The system of claim 14 further comprising a plurality of alignment pins on the first rotor for engaging the second rotor to align the workpiece within the processing chamber.

17. A system for processing a workpiece, comprising:
  a plurality of workpiece processors, with at least one of the workpiece processors comprising:
    a first rotor;
    a second rotor engageable with the first rotor to form a workpiece processing chamber;
    a shield plate between the first and second rotors for directing the first processing fluid to the edge of the workpiece; and
    a robot moveable between the workpiece processors for loading and unloading the workpiece into and out of one or more of the processors.

18. The system of claim 17 further comprising a fluid applicator for delivering a processing fluid onto the shield plate.

19. The system of claim 17 further comprising a purge gas source for supplying a purge gas through a central opening in the shield plate.

20. The system of claim 17 further comprising a plurality of support pins on the first rotor for contacting an upper surface of the workpiece, with the support pins positioned to contact the upper surface of the workpiece at locations outside of a fluid path of the first processing fluid.

21. The system of claim 20 further including a drain groove in the first rotor and wherein the support pins are positioned radially inwardly from an outer edge of the drain groove by at least 2 mm.

22. A system for processing a workpiece, comprising:
  a plurality of workpiece processors, with at least one of the workpiece processors including:
    a first rotor;
    a second rotor engageable with the first rotor to form a workpiece processing chamber;
    a process fluid supply line in the second rotor having an outlet adjacent to an outside surface of the process chamber, for supplying a process fluid directly to an edge area of a workpiece, when a workpiece is placed into the processor; and
    a robot moveable between the processors.

23. A system for processing a workpiece, comprising:
a plurality of workpiece processors, with at least one of the workpiece processors comprising:
a first rotor including an alignment means;
a second rotor including a receiving means for receiving the alignment means, with the first and second rotors forming a workpiece processing chamber when the alignment means is en with the receiving means; and
a robot moveable between the workpiece processors for loading and unloading the workpiece into and out of one or more of the processors.

24. The system of claim 23 further comprising a first fluid delivery means for delivering a first processing fluid to an upper surface of the workpiece, and a second fluid delivery means for delivering a second processing fluid to an edge of the workpiece.

25. A workpiece processor, comprising:
a first rotor including a plurality of alignment pins;
a second rotor including one or more receiving surfaces for receiving the alignment pins, with the first and second rotors forming a workpiece processing chamber when the alignment pins are engaged with the second rotor;
at least one inlet leading into the processing chamber, for supplying a process liquid onto the workpiece; and
at least one outlet in the processing chamber for removing process liquid.

26. The processor of claim 25 wherein the alignment pins are positioned at least partially around a periphery of the first rotor such that an inner surface of each of the alignment pins contacts or closely contains an edge of the workpiece to align the workpiece within the processing chamber.

27. The processor of claim 25 further comprising a plurality of support pins on at least one of the first rotor and the second rotor for contacting at least one of an upper surface and a lower surface of a workpiece located in the processing chamber, and with the support pins positioned to contact the workpiece at locations outside of a fluid path used for processing an edge of the workpiece.

28. The processor of claim 27 further comprising a drain groove in the first rotor, and wherein the support pins are positioned at least 3 mm radially inwardly from an outer edge of the drain groove.

29. The processor of claim 25 wherein the receiving surface comprises a tapered wall on the second rotor.

30. The processor of claim 25 further comprising a fluid delivery path extending through at least one of the first rotor and the second rotor and terminating adjacent a circumferential outer edge of the rotor.

31. A workpiece processor, comprising:
a first rotor;
a second rotor engageable with the first rotor to form a workpiece processing chamber;
a fluid applicator for delivering a processing fluid to a central portion of a workpiece located in the processing chamber;
a substantially annular opening around an outer periphery of the fluid applicator; and
a purge gas source for delivering a purge gas through the annular opening into the processing chamber.

32. The processor of claim 31 further including a fluid delivery tube within the fluid applicator and terminating flush with a lower end of the fluid applicator.

33. A workpiece processor, comprising:
a first rotor;
a second rotor engageable with the first rotor to form a workpiece processing chamber;
at least one chamber inlet for providing a process liquid into the processing chamber; and
a shield plate between the first and second rotors for directing a processing fluid to the edge of the workpiece.

34. The processor of claim 33 further comprising a fluid applicator for delivering a processing fluid onto the shield plate.

35. The processor of claim 33 further comprising a purge gas source for supplying a purge gas through a central opening in the shield plate.

36. A system for processing a workpiece, comprising:
a first rotor;
a second rotor engageable with the first rotor to form a workpiece processing chamber; and
a process fluid supply line in the second rotor having an outlet adjacent to an outside surface of the process chamber, for supplying a process fluid directly to an edge area of a workpiece, when a workpiece is placed into the processor.

37. A workpiece processor, comprising:
a first rotor including alignment means;
a second rotor including a receiving means for receiving the alignment means, with the first and second rotors forming a workpiece processing chamber when the alignment means is engaged with the receiving means;
at least one inlet in the processing chamber, for providing a process liquid into the processing chamber; and
at least one outlet in the processing chamber, for removing process liquid from the processing chamber.

* * * * *